United States Patent
Jeon et al.

(10) Patent No.: US 7,550,391 B2
(45) Date of Patent: Jun. 23, 2009

(54) METHOD FOR FORMING FINE PATTERNS OF A SEMICONDUCTOR DEVICE USING DOUBLE PATTERNING

(75) Inventors: Kyung-yub Jeon, Yongin-si (KR); Myeong-cheol Kim, Suwon-si (KR); Hak-sun Lee, Suwon-si (KR); Je-woo Han, Hongseong-gun (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 264 days.

(21) Appl. No.: 11/730,292

(22) Filed: Mar. 30, 2007

(65) Prior Publication Data
US 2008/0090418 A1   Apr. 17, 2008

(30) Foreign Application Priority Data
Oct. 17, 2006   (KR) .................. 10-2006-0101028

(51) Int. Cl.
*H01L 21/302* (2006.01)
*H01L 21/461* (2006.01)

(52) U.S. Cl. .................. 438/717; 438/723; 438/947; 257/E21.023; 257/21.037

(58) Field of Classification Search .................. 438/717, 438/723, 724, 942, 947; 257/E21.023, E21.035, 257/E21.037; 430/312, 313
See application file for complete search history.

(56) References Cited

U.S. PATENT DOCUMENTS

| | | | |
|---|---|---|---|
| 7,208,423 B2 * | 4/2007 | Hashimoto et al. .......... 438/717 |
| 2003/0087167 A1 * | 5/2003 | Popp .............................. 430/5 |
| 2003/0091936 A1 * | 5/2003 | Rottstegge et al. .......... 430/312 |
| 2006/0024590 A1 * | 2/2006 | Sandhu .......................... 430/5 |
| 2006/0063077 A1 * | 3/2006 | Hata et al. ...................... 430/5 |
| 2006/0127816 A1 * | 6/2006 | Kang et al. ................. 430/312 |
| 2006/0160028 A1 * | 7/2006 | Lee et al. .................... 430/312 |
| 2006/0240361 A1 * | 10/2006 | Lee et al. .................... 430/313 |
| 2007/0048625 A1 * | 3/2007 | Nordquist et al. .............. 430/5 |

FOREIGN PATENT DOCUMENTS

| JP | 07-307333 | 11/1995 |
|---|---|---|
| KR | 1020050066933 A | 6/2005 |
| KR | 100574999 B1 | 4/2006 |

* cited by examiner

*Primary Examiner*—Walter L Lindsay, Jr.
(74) *Attorney, Agent, or Firm*—Volentine & Whitt, PLLC (57) ABSTRACT

A method for forming fine patterns of a semiconductor device is disclosed. The method includes forming an etch film on a substrate, forming a protection film on the etch film, forming a hard mask layer on the protection film, and forming a plurality of first mask patterns characterized by a first pitch on the hard mask layer. The method further comprises forming a plurality of second mask patterns, forming hard mask patterns exposing portions of the protection film by etching the hard mask layer using the first and second mask patterns as an etch mask, and removing the first and second mask patterns. The method still further comprises exposing portions of the etch film and forming a plurality of fine patterns characterized by a second pitch equal to half of the first pitch by etching the etch film using at least the hard mask patterns as an etch mask.

46 Claims, 9 Drawing Sheets

METHOD FOR FORMING FINE PATTERNS OF A SEMICONDUCTOR DEVICE USING DOUBLE PATTERNING

BACKGROUND OF THE INVENTION

1. Field of the Invention

Embodiments of the invention relate to a method for forming fine patterns of a semiconductor device. In particular, embodiments of the invention relate to a method for forming fine patterns of a semiconductor device using hard mask patterns characterized by a relatively fine pitch and formed through double patterning.

This application claims priority to Korean Patent Application No. 10-2006-0101028, filed on Oct. 17, 2006, the subject matter of which is hereby incorporated by reference in its entirety.

2. Description of the Related Art

In order to fabricate semiconductor devices having high degrees of integration, very small patterns must be formed. Additionally, individual elements may be made smaller in order to increase the number of elements disposed in a selected area of a semiconductor device. Making individual elements smaller may be accomplished by reducing the pitch that characterizes a plurality of patterns formed in a semiconductor device. "Pitch" is defined as the sum of the width of a pattern and the distance between the pattern and an adjacent pattern. Presently, due to resolution restrictions of photolithography techniques, the drastic decrease in the design rule for semiconductor devices has reached a limit with regard to how small of a pitch characterizing a plurality of patterns may be. In particular, because of the resolution restrictions of photolithography techniques for forming a device isolation region that defines an active region in a substrate, and for forming a line and space (L/S) pattern, the ability to form patterns characterized by a pitch that is as small as desired is limited.

In order to overcome the limitations mentioned above, methods for forming hard mask patterns characterized by a fine pitch (i.e., a relatively small pitch) using double patterning have been suggested. In one of the suggested methods, polysilicon is used as an etch mask material for forming the hard mask patterns. However, when using polysilicon as an etch mask material for forming hard mask patterns, desired etching characteristics cannot be obtained because, when the polysilicon etch mask remains as a hard mask pattern, the polysilicon is exposed to harsh environmental conditions that characterize conventional etching processes. For example, when a tungsten (W) film is formed under a hard mask and the tungsten (W) film is etched using the hard mask pattern as an etch mask, some fluoride (F) atoms of the etchant used for etching the tungsten (W) film are lost due to a chemical reaction between fluoride (F) atoms of the etchant and silicon (Si) atoms of the polysilicon. Thus, not all of the etchant used for etching the tungsten (W) film actually etches the tungsten (W) film. Consequently, the rate at which the tungsten (W) film is etched is reduced, and a sidewall profile of a tungsten (W) film pattern formed through the etching process has an inclined shape with a relatively large angle of inclination.

Also, when the height of the polysilicon film remaining on the hard mask pattern is not uniform, a sidewall profile of a trench formed in a semiconductor substrate will be formed asymmetrically because etchant will be scattered in an edge portion of the polysilicon film when etching a substrate using the hard mask pattern as an etch mask to form a device isolation trench. Thus, operational characteristics of the semiconductor devices may be adversely affected and product yield may be reduced.

SUMMARY OF THE INVENTION

Embodiments of the invention provide a method for forming fine patterns of a semiconductor device that can substantially prevent problems that may be caused by polysilicon remaining on a hard mask pattern when using a hard mask formed by double patterning as an etch mask to produce patterns characterized by a fine pitch that is smaller than can be produced through photolithography techniques due to resolution restrictions of photolithography techniques. In accordance with embodiments of the invention, an etch film is etched after removing mask patterns formed from polysilicon to substantially prevent the mask patterns formed from polysilicon from causing the rate at which the etch film is etched to be reduced and causing of the fine patterns to have relatively poor sidewall profiles. Therefore, in accordance with embodiments of the invention, fine patterns having desirable vertical sidewall profiles can be produced.

In one embodiment, the invention provides a method for forming fine patterns of a semiconductor device comprising forming an etch film on a substrate, forming a protection film on the etch film, forming a hard mask layer on the protection film, and forming a plurality of first mask patterns characterized by a first pitch on the hard mask layer. The method further comprises forming a plurality of second mask patterns, wherein each second mask pattern is disposed between two adjacent first mask patterns of the plurality of first mask patterns; forming hard mask patterns exposing first portions of the protection film by etching the hard mask layer using the first and second mask patterns as an etch mask; and removing the first and second mask patterns. The method still further comprises exposing portions of the etch film by removing the first portions of the protection film, and forming a plurality of fine patterns characterized by a second pitch equal to half of the first pitch by etching the etch film using at least the hard mask patterns as an etch mask.

In another embodiment, the invention provides a method for forming fine patterns of a semiconductor device comprising forming an etch film on a substrate, forming a hard mask layer on the etch film, forming a plurality of first mask patterns characterized by a first pitch on the hard mask layer, and forming a plurality of second mask patterns, wherein each second mask pattern is disposed between two adjacent first mask patterns of the plurality of first mask patterns. The method further comprises forming a hard mask pattern layer comprising first hard mask patterns and residual protection films by etching the hard mask layer using the first and second mask patterns as an etch mask, wherein each residual protection film covers one of a plurality of first portions of the etch film and each first portion of the etch film is disposed between a pair of adjacent first hard mask patterns; removing the first and second mask patterns; exposing portions of the etch film and forming second hard mask patterns by removing the residual protection films; and forming a plurality of fine patterns characterized by a second pitch equal to half of the first pitch by etching the etch film using the second hard mask patterns as an etch mask.

BRIEF DESCRIPTION OF THE DRAWINGS

Embodiments of the invention will be described with reference to the accompanying drawings, in which.

DESCRIPTION OF EMBODIMENTS

In the drawings, the thicknesses of layers and regions are not necessarily drawn to scale. Also, as used herein, when a first element or layer is described as being "on" a second element or layer, the first element or layer may be directly on the second element or layer or one or more intervening elements or layers may be present. However, when a first element or layer is described as being "directly on" a second element or layer, no intervening elements or layers may be present. Likewise, when a first element is described as being directly on a plane, no intervening elements or layers are present between the first element and the plane. Also, in the drawings, like reference symbols indicate like or similar elements throughout.

FIGS. 1A through 1L are cross-sectional views illustrating a method for forming fine patterns of a semiconductor device in accordance with an embodiment of the invention. FIGS. 1A through 1L may be referred to herein as FIG. 1. Thus, the embodiment illustrated in FIGS. 1A through 1L may be referred to herein as the embodiment illustrated in FIG. 1.

Figure 1A:
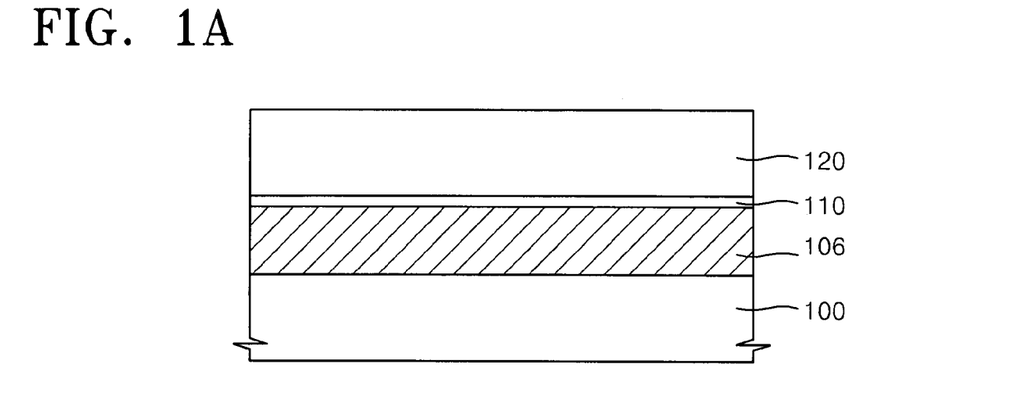
FIGS. 1A through 1L are cross-sectional views illustrating a method for forming fine patterns of a semiconductor device in accordance with an embodiment of the invention.

Referring to FIG. 1A, an etch film 106 is formed on a substrate 100. Etch film 106 may be a conductive layer or an insulating layer commonly used in the fabrication of semiconductor devices. In addition, etch film 106 may comprise a metal, a semiconducting material, or an insulating material. For example, etch film 106 may comprise at least one of tungsten (W), a tungsten silicide, polysilicon, and aluminum (Al).

In addition, a protection film 110 is formed on etch film 106. Protection film 110 protects etch film 106 from being damaged when forming a hard mask pattern. Protection film 110 may be a nitride film or an oxide film. Protection film 110 may be relatively thin and have a thickness of about 50 to 400 Å.

A hard mask layer 120 is formed on protection film 110. Hard mask layer 120 may be formed from one or more materials selected in accordance with the composition of etch film 106, an intended etching process, and the desired pattern of hard mask layer 120. For example, hard mask layer 120 may comprise at least one of an oxide film and a nitride film. In particular, the hard mask layer may comprise, for example, a nitride film disposed on etch film 106 and an oxide film disposed on the nitride film. Also, when etch film 106 is an insulating film or a conductive film, hard mask layer 120 is formed from a material having an etch selectivity relative to a material from which etch film 106 is formed.

Protection film 110 and hard mask layer 120 are formed from materials having different etch characteristics, i.e., materials having different etch selectivities relative to one another with respect to predetermined etching conditions. For example, when protection film 110 is formed from a nitride film, hard mask layer 120 is an oxide film. Alternatively, if protection film 110 is an oxide film, then hard mask layer 120 is a nitride film.

As an example, when protection film 110 is a nitride film, hard mask layer 120 may comprise at least one oxide film selected from the group consisting of a thermal oxidation film, chemical vapor deposition (CVD) oxide film, an undoped silicate glass (USG) film, and a high density plasma (HDP) oxide film. Otherwise, if protection film 110 is formed from an oxide film, then hard mask layer 120 may comprise at least one film selected from the group consisting of SiON, SiN, SiBN, and BN. Also, hard mask layer 120 may comprise multiple layers wherein the multiple layers comprise at least one oxide film selected from the oxide films listed above and at least one nitride film selected from the nitride films listed above.

Figure 1B:
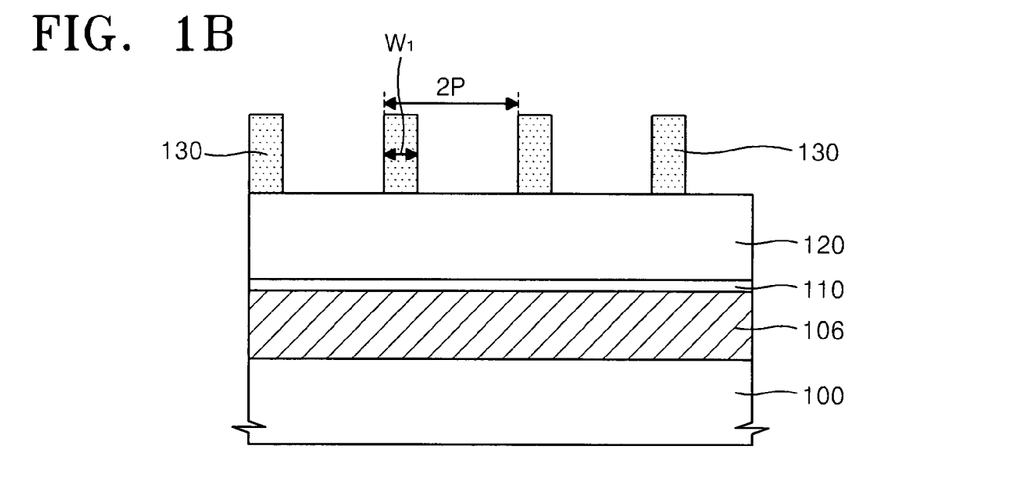

Referring to FIG. 1B, a plurality of first mask patterns 130 are formed on hard mask layer 120 using photolithography. First mask patterns 130 may be formed from a polysilicon film. First mask patterns 130 are characterized by a first pitch 2P. Hard mask patterns 120a, which will be formed subsequently (see, e.g., FIG. 1L), will be characterized by a second pitch P that is equal to half of first pitch 2P. In addition, each of first mask patterns 130 has a first width $W_1$ that may be equal to one fourth (¼) of first pitch 2P. In the embodiment illustrated in FIG. 1, it will be assumed that $W_1$ is equal to one fourth (¼) of first pitch 2P. First mask patterns 130 may be a plurality of line patterns formed on substrate 100 in a predetermined direction, and may be characterized by first pitch 2P.

Figure 1C:
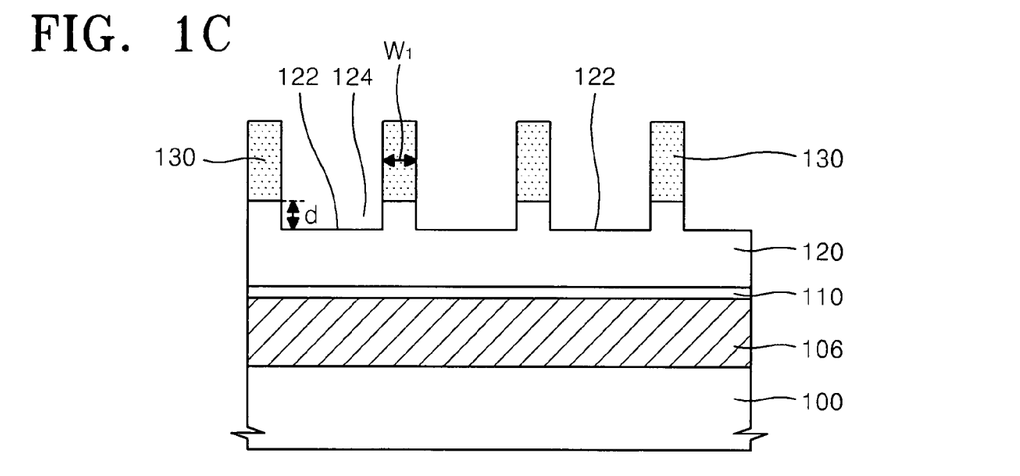

Referring to FIG. 1C, hard mask layer recesses 124 are formed in the upper surface of hard mask layer 120 by removing upper exposed portions of hard mask layer 120 exposed between first mask patterns 130. As used herein, an "upper exposed portion" of hard mask layer 120 removed to form hard a mask layer recess 124 is an upper portion of a portion of hard mask layer 120 exposed between adjacent first mask patterns 130. Each of hard mask layer recesses 124 has a depth equal to a recess depth d. That is, at each portion of hard mask layer 120 exposed between adjacent first mask patterns 130, the upper surface of the exposed portion of hard mask layer 120 is removed to a depth equal to recess depth d. Through forming hard mask layer recesses 124, low surface portions 122 of hard mask layer 120 are formed.

Recess depth "d" may be equal to first width $W_1$ of first mask patterns 130. In addition, low surface portions 122 may be formed in the upper surface of hard mask layer 120 through dry etching. For example, when forming first mask patterns 130, as described with reference to FIG. 1B, when dry etching is performed to etch first mask patterns 130, after the dry etching performed to etch first mask patterns 130 has formed first mask patterns 130, over-etching may occur and thereby form hard mask layer recesses 124 and low surface portions 122 in hard mask layer 120. That is, the dry etching process may continue even after first mask patterns 130 have been formed to thereby form hard mask layer recesses 124 and low surface portions 122 in hard mask layer 120. Alternatively, a dry etching process separate from the dry etching process performed to form first mask patterns 130 may be performed in order to form low surface portions 122.

Figure 1D:
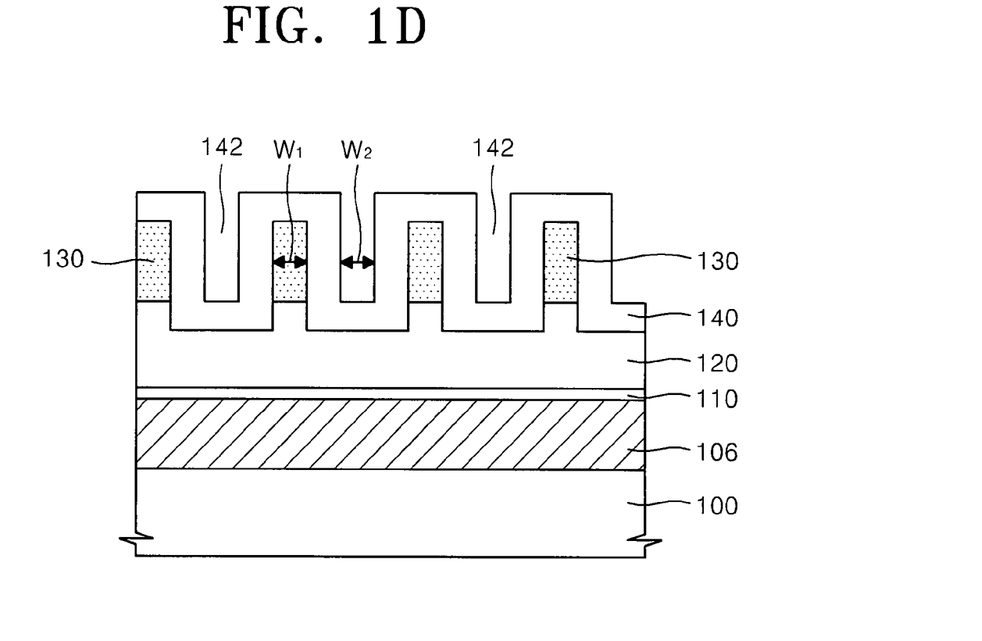

Referring to FIG. 1D, a buffer layer 140 is formed on first mask patterns 130. Buffer layer 140 has recesses 142, and each recess 142 is disposed between two adjacent first mask patterns 130. The formation of buffer layer 140 ensures that the heights of respective lower surfaces of subsequently formed second mask patterns (see, e.g., 105a of FIG. 1F) are the same as the heights of respective lower surfaces of first mask patterns 130. That is, the formation of buffer layer 140 ensures that bottom surfaces of first mask patterns 130 and bottom surfaces of the second mask patterns are all approximately disposed directly on a single plane parallel with a working surface of substrate 100. First mask patterns 130 and the subsequently formed second mask patterns will be used as an etch mask for patterning hard mask layer 120. As used herein, a "height" is a distance from the working surface of a corresponding substrate (e.g., substrate 100) along a first direction substantially perpendicular to the working surface of the substrate.

Referring to FIG. 1D, buffer layer 140 conformally covers the upper surfaces and sidewalls of first mask patterns 130, and low surface portions 122 (see FIG. 1C) of hard mask layer 120, with a uniform thickness. In particular, in the embodiment illustrated in FIG. 1, the uniform thickness with which buffer layer 140 covers first mask patterns 130 and lower surface portions 122 of hard mask layer 120 is equal to recess depth d. In addition, the thickness of buffer layer 140 is set such that a second width $W_2$ of each recess 142 of buffer layer 140 is equal to first width $W_1$ of first mask pattern 130.

Buffer layer 140 may be formed from a material having etching characteristics similar to those of hard mask layer 120 (i.e., similar to those of the material from which hard mask layer 120 is formed). For example, buffer layer 140 and hard mask layer 120 may be formed from different materials having similar etching characteristics. As an alternative example, hard mask layer 120 and buffer layer 140 may each be an oxide layer. Additionally, buffer layer 140 may be an oxide film or a nitride film formed by atomic layer deposition (ALD).

Figure 1E:
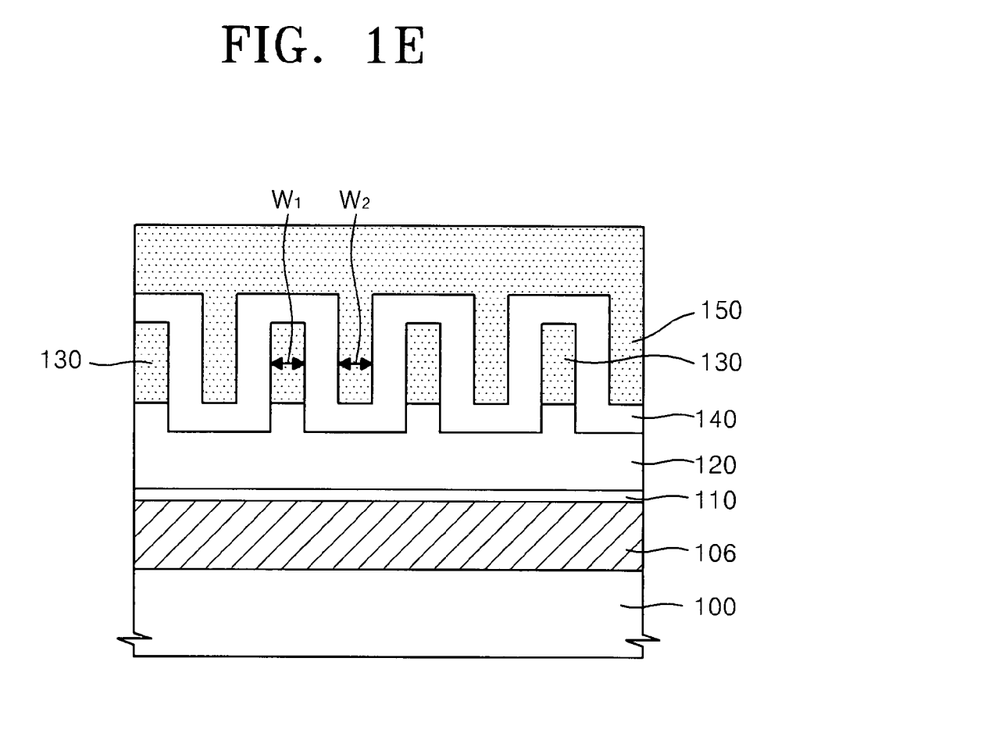

Referring to FIG. 1E, after buffer layer 140 is formed on substrate 100, a second mask layer 150 is formed on substrate 100 (and, in particular, on buffer layer 140). Second mask layer 150 is formed from polysilicon. Through forming second mask layer 150, recesses 142 are filled with second mask layer 150. When the thickness of buffer layer 140 is equal to one fourth (¼) of first pitch 2P, second width $W_2$ of each recess 142 (and thus of each portion of second mask layer 150 that fills a recess 142) is equal to one fourth (¼) of first pitch 2P, so second width $W_2$ is also equal to first width $W_1$ of first mask patterns 130.

Figure 1F:
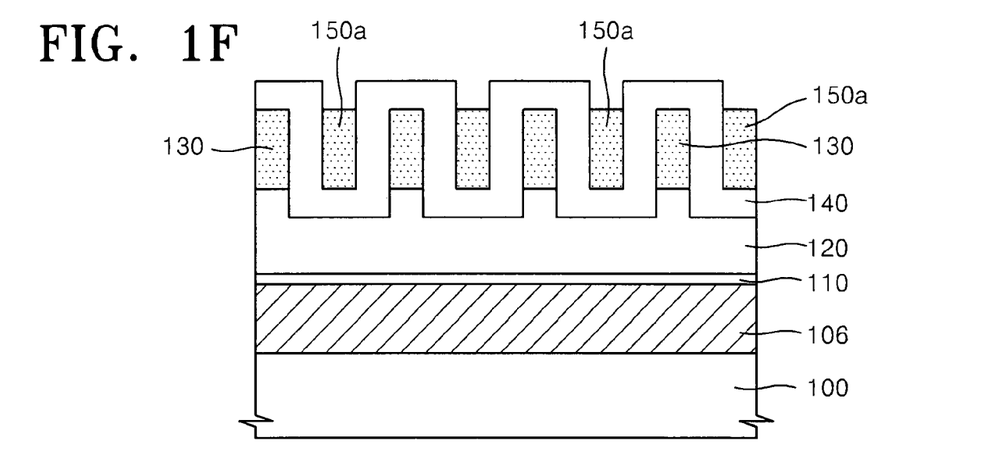

Referring to FIG. 1F, second mask layer 150 is partially removed to form second mask patterns 150a in recesses 142. In addition, partially removing second mask layer 150 exposes the portions of buffer layer 140 disposed between adjacent second mask patterns 150a and covering first mask patterns 130.

The amount that second mask layer 150 is, etched when partially removing second mask layer 150 can be controlled so that the heights of the upper surfaces of the resulting second mask patterns 150a are the same as the heights of the upper surfaces of first mask patterns 130. Wet etching, for example, may be used to partially remove second mask layer 150.

Second mask patterns 150a may, for example, form a plurality of line patterns extending in the same direction as first mask patterns 130 when first mask patterns 130 are also line patterns formed on substrate 100. Bottom surfaces of second mask patterns 150a disposed in recesses 142 and bottom surfaces of first mask patterns 130 are all approximately disposed directly on the same horizontal plane (i.e., the same plane parallel with a working surface of substrate 100). As used herein, the term "horizontal" is to be interpreted with reference to the orientation of the corresponding structure illustrated in the drawings. Also, in each of the drawings, the working surface of the substrate is horizontal.

Figure 1G:
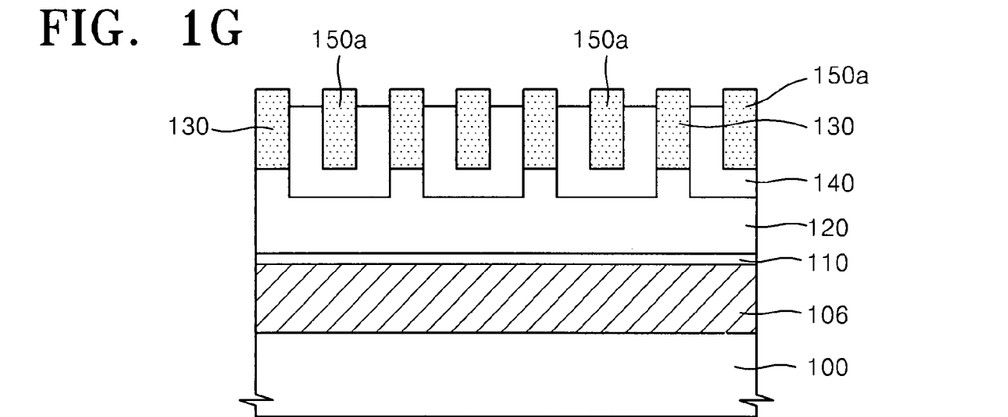

Referring to FIG. 1G, exposed portions of buffer layer 140 are partially removed. That is, portions of buffer layer 140, including portions of buffer layer 140 covering upper surfaces of first mask patterns 130, are removed to expose the upper surfaces of first mask patterns 130. Thus, after removing portions of buffer layer 140 to expose upper surfaces of first mask patterns 130, the upper surfaces of first mask patterns 130 and the upper surfaces of second mask patterns 150a are simultaneously exposed, wherein first and second mask patterns 130 and 150a are disposed on substrate 100. This process for removing portions of buffer layer 140 without exposing portions of hard mask layer 120 can be omitted if necessary.

Wet etching may be used to remove the portions of buffer layer 140 covering the upper surfaces of first mask patterns 130. For example, when buffer layer 140 is an oxide film, buffer layer 140 has a relatively high etch selectivity with respect to first and second mask patterns 130 and 150a and may be selectively removed using an etchant comprising fluoride (F), e.g., comprising at least one of diluted HF (DHF) and $NH_4F$.

Alternatively, dry etching may be used to remove portions of buffer layer 140 that cover the upper surfaces of first mask patterns 130. When using dry etching to remove portions of buffer layer 140 that cover the upper surfaces of first mask patterns 130, $C_xF_y$ may be used as the etchant. As used herein, "x" is an integer in a range of 1 to 10 and "y" is also an integer in a range of 1 to 10. Alternatively, a mixed gas obtained by mixing $C_xF_y$, $O_2$, and Ar may be used as the etchant. $C_xF_y$ gas may be, for example, $C_4F_6$ or $C_4F_8$.

Figure 1H:
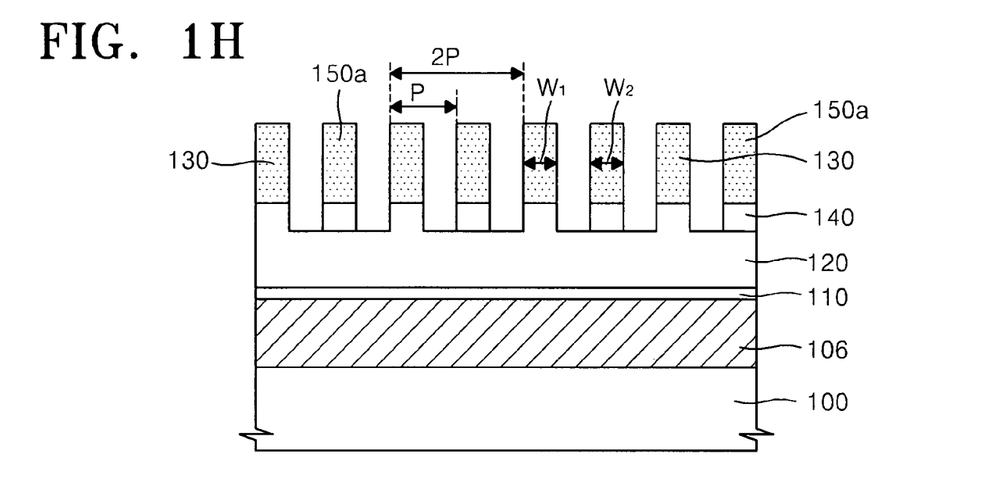

Referring to FIG. 1H, using first and second mask patterns 130 and 150a as an etch mask, buffer layer 140 is anisotropically etched to partially expose hard mask layer 120 between the first and second mask patterns 130 and 150a of mask pattern pairs 130,150a. As used herein, a "mask pattern pair" 130,150a comprises one of first mask patterns 130 and one of second mask patterns 150a, wherein the one of first mask patterns 130 and the one of second mask patterns 150a are adjacent to one another. Each first mask pattern 130 and each second mask pattern 150a may be a part of more than one mask pattern pair 130, 150a.

In the embodiment illustrated in FIG. 1, as shown in FIG. 1H, each second mask pattern 150a has a width equal to second width $W_2$ (i.e., each second mask pattern 150a has second width $W_2$). Second width $W_2$ is equal to first width $W_1$ of first mask pattern 130, and first width $W_1$ of first mask pattern 130 is equal to one fourth (¼) of first pitch 2P. Because each second mask pattern 150a has second width $W_2$, first mask patterns 130, each having first width $W_1$, and second mask patterns 150a, each having second width $W_2$, collectively form a mask pattern disposed on hard mask layer 120 (and disposed on substrate 100) wherein the mask pattern is characterized by a pitch P (i.e., a fine pitch P) equal to one half (½) of first pitch 2P.

Figure 1I:
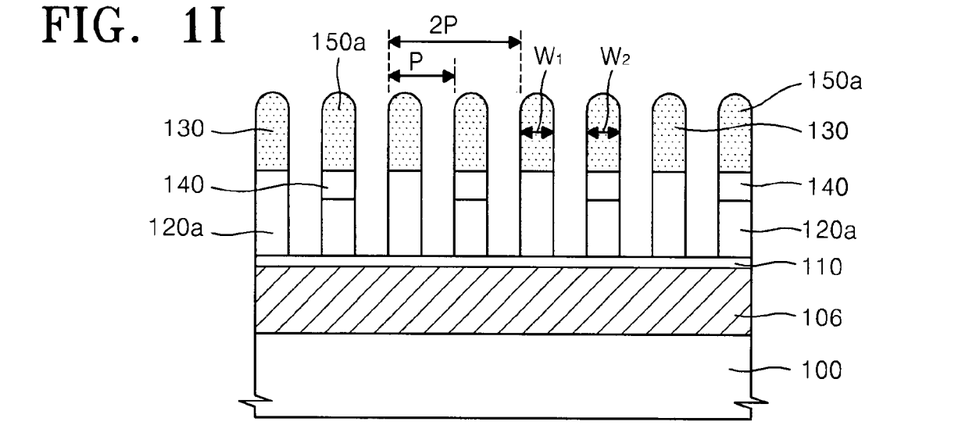

Referring to FIG. 1I, hard mask layer 120 is anisotropically dry-etched using first and second mask patterns 130 and 150a as an etch mask, thereby forming hard mask patterns 120a characterized by fine pitch P, which is equal to one half (½) of first pitch 2P. In the resultant structure illustrated in FIG. 1I, first mask patterns 130 and second mask patterns 150a are partially etched while dry etching hard mask layer 120. In addition, hard mask patterns 120a expose portions of protection film 110, wherein the portions of protection film 110 that are exposed are the portions of protection film 110 disposed between adjacent hard mask patterns 120a.

When hard mask layer 120 is formed from an oxide film and buffer layer 140 is formed from an oxide film, in order to remove portions of each of buffer layer 140 and hard mask layer 120 with a high etch selectivity with respect to first and second mask patterns 130 and 150a (formed from polysilicon) and protection film 110 (formed from nitride) while etching buffer layer 140 (as described with reference to FIG. 1H) and etching hard mask layer 120 (as described with reference to FIG. 1I), dry etching may be performed using a mixed gas comprising $C_aF_b$ as an etchant. As used herein, "a" is an integer in a range of 1 to 6 and "b" is an integer in a range of 3 to 8. The dry etching may be performed using, for example, an etchant obtained by mixing, in a volume ratio of 1:1, $O_2$ gas and any gas such as $C_3F_8$, $C_4F_8$, and $C_5F_8$. Ar may be added to the etchant as needed. In addition, the dry etching process may be performed in a plasma atmosphere generated from the etchant.

In addition, when hard mask layer 120 is formed from a nitride film and buffer layer 140 is formed from a nitride film, in order to remove portions of each of buffer layer 140 and hard mask layer 120 with a high etch selectivity with respect to first and second mask patterns 130 and 150a (formed from polysilicon) and protection film 110 (formed from oxide) while etching buffer layer 140 (as described with reference to FIG. 1H) and etching hard mask layer 120 (as described with reference to FIG. 1I), dry etching may be performed using an etchant comprising $CH_nF_m$. As used herein, "n" is an integer in a range of 1 to 3 and "m" is an integer in a range of 1 to 3, wherein n+m=4. The etchant may comprise, for example, at least one of $CH_2F_2$ and $CH_3F$. $O_2$ gas may be added to the etchant as needed. In addition, dry etching may be performed in a plasma atmosphere generated by the etchant.

Figure 1J:
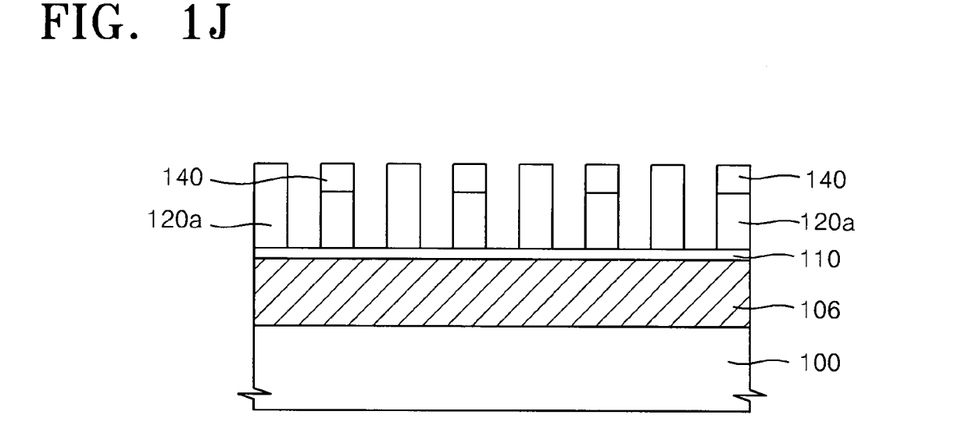

Referring to FIG. 1J, the portions of first mask patterns 130 remaining on hard mask patterns 120a and the portions of second mask patterns 150a remaining on hard mask patterns 120a and buffer layer 140 are removed. Dry etching or wet etching may be used to remove first and second mask patterns 130 and 150a. For example, dry etching using a mixed gas comprising HBr and $O_2$ as an etchant can be used for removing first and second mask patterns 130 and 150a. When performing the dry etching, the HBr and $O_2$ gases may be supplied at a flow rate ratio (i.e., the flow rate of the HBr: the flow rate of the $O_2$) in a range of about 10:1 to 30:1. In addition to the etchant, He gas may be supplied during the dry etching process. HBr gas may be supplied at about 100 to 300 sccm, $O_2$ gas may be supplied at about 5 to 30 sccm, and He gas may be supplied at about 50 to 200 sccm. In addition, in some cases, $Cl_2$ gas may be used instead of HBr gas, or a mixed gas of HBr and $Cl_2$ may be used instead of HBr gas alone.

The dry etching process performed to remove first and second mask patterns 130 and 150a can be performed in the plasma atmosphere generated by the etchant. Alternatively, in order to remove first and second mask patterns 130 and 150a, wet etching using an etchant that comprises a mixed solution comprising $NH_4OH$, $H_2O_2$, and $H_2O$ may be used. When an etchant comprising the previously-described mixed solution is used, the mixed solution (i.e., the etchant) may be mixed in a volume ratio of $NH_4OH:H_2O_2:H_2O$ is 4:1:95.

Because etch film 106 is covered by protection film 110 when first and second mask patterns 130 and 150a are removed, etch film 106 is not damaged when removing first and second mask patterns 130 and 150a.

Figure 1K:
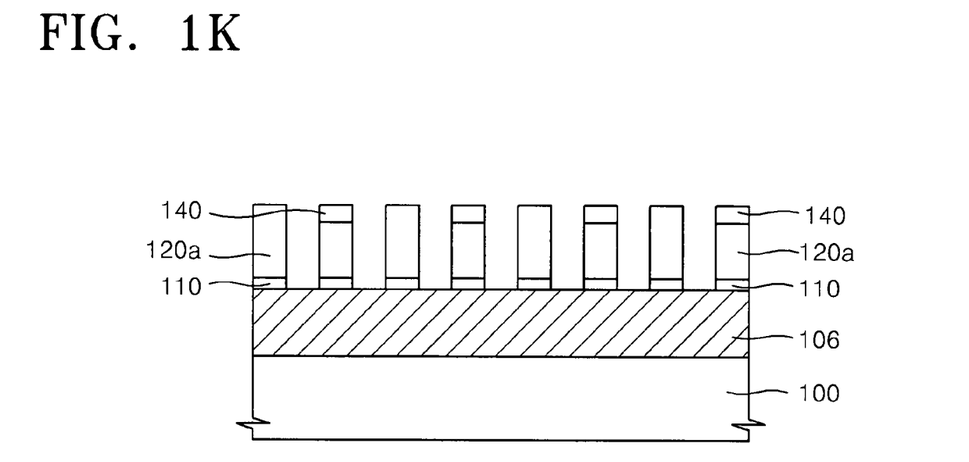

Referring to FIG. 1K, hard mask patterns 120a and buffer layer 140 are used as an etch mask when etching protection film 110 in order to remove the portions of protection film 110 exposed between adjacent hard mask patterns 120a. Additional description of a method for removing portions of protection film 110 is set. forth below with reference to FIG. 1L.

Figure 1L:
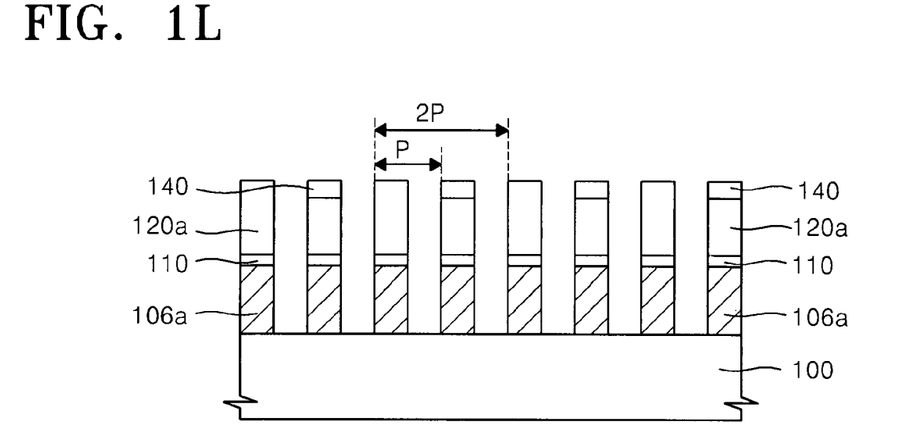

Referring to FIG. 1L, etch film 106 is anisotropically dry etched using hard mask patterns 120a and buffer layer 140 as an etch mask to form fine patterns 106a. When etch film 106 is formed from tungsten (W), dry etching may, for example, be performed using a gas containing fluoride (F) atoms, such as $NF_3$ and $SF_6$. The etching (i.e., removal) of portions of protection film 110 (mentioned above with reference to FIG. 1K) and the etching of etch film 106 can be performed successively under the same etching conditions. That is, portions of protection film 110 may be removed in the same chamber as the chamber in which etch film 106 is etched and under the same etching conditions as those used for etching etch film 106. Because it is relatively thin, protection film 110 can be removed well even under the etching conditions used for etching etch film 106.

Also, since the dry etching of etch film 106 is performed after first and second mask patterns 130 and 150a formed from polysilicon and disposed on hard mask patterns 120a and buffer layer 140 are removed, problems that may occur as a result of polysilicon being exposed in an etching atmosphere (e.g., reduced etch rate while etching etch film 106, and the etching of etch film 106 producing fine patterns 106a having relatively poor sidewall profiles) can be substantially prevented.

As illustrated in FIGS. 1K and 1L, buffer layer 140 and selected hard mask patterns 120a are etched while etching protection film 110 and etch film 106. Thus, the respective heights of upper surfaces of buffer layer 140 and upper surfaces of selected hard mask patterns 120a are reduced. As used herein, the "selected" hard mask patterns 120a are the hard mask patterns 120a on which buffer layer 140 is not disposed.

Fine patterns 106a formed by dry etching of etch film 106 have a desirable pattern shape including a vertical sidewall profile, and have a width of either first width $W_1$ or second width $W_2$, each of which is equal to one fourth (¼) of first pitch 2P. In addition, fine patterns 106a are characterized by pitch P, which is equal to one half (½) of first pitch 2P.

In addition, although not shown in FIG. 1, after etching etch film 106 to form fine patterns 106a, trenches may be formed in semiconductor substrate 100 by etching semiconductor substrate 100 using at least hard mask patterns 120a as an etch mask. Then, isolation regions may be formed by filling the trenches with an insulating film. The process of forming isolation regions by filling the trenches with an insulating film may be performed through a process similar to the process described below with reference to FIG. 3G.

FIGS. 2A through 2E are cross-sectional views illustrating a method for forming fine patterns of a semiconductor device in accordance with another embodiment of the invention. In FIGS. 2A through 2E (i.e., FIG. 2) and FIGS. 1A through 1L (i.e., FIG. 1), like reference symbols indicate like or similar elements, so elements present in FIGS. 1 and 2 may not be described again with reference to FIG. 2.

Figure 2A:
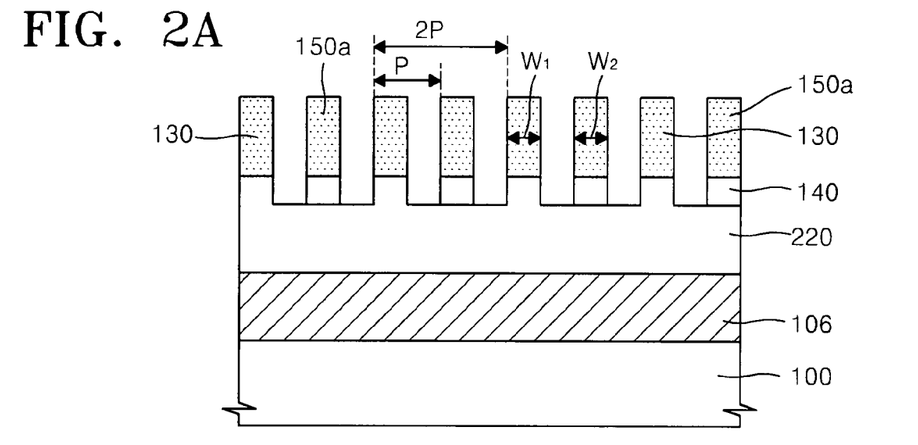
FIGS. 2A through 2E are cross-sectional views illustrating a method for forming fine patterns of a semiconductor device in accordance with another embodiment of the invention; and, FIGS. 3A through 3G are cross-sectional views illustrating a method for forming fine patterns of a semiconductor device in accordance with yet another embodiment of the invention.

Referring to FIG. 2A, as described with reference to FIGS. 1A through 1H, first and second mask patterns 130 and 150a are formed on substrate 100 and buffer layer 140 (see FIGS. 1G and 1H) is partially removed through anisotropic etching. While, in the embodiment illustrated in FIG. 1, protection film 110 is formed on etch film 106, protection film 110 is not formed on etch film 106 in the embodiment illustrated in FIG. 2. Also, hard mask layer 220 of the embodiment illustrated in FIG. 2 is thicker than hard mask layer 120 of the embodiment illustrated in FIG. 1. The thickness of hard mask layer 220 may be set to be, for example, greater than or equal to the sum of the thickness of hard mask layer 120 and the thickness of protection film 110 of the embodiment illustrated in FIG. 1. In the embodiment illustrated in FIG. 1, hard mask layer 220 and buffer layer 140 may each be formed from nitride.

Figure 2B:
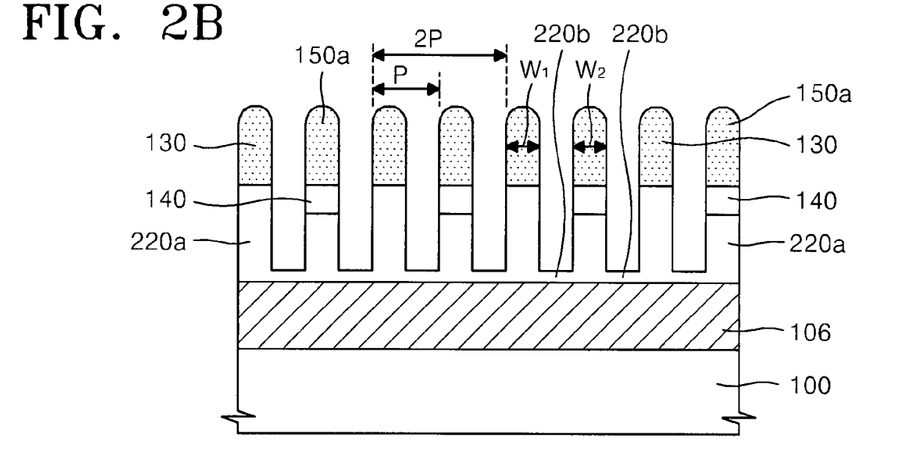

Referring to FIG. 2B, hard mask layer 220 is anisotropically dry etched to form a hard mask pattern layer comprising hard mask patterns 220a and residual protection films 220b using a method similar to the method for etching hard mask layer 120 described with reference to FIG. 1I. Residual protection films 220b of the hard mask pattern layer are disposed on etch film 106 and will be etched away subsequently. Each of residual protection films 220b covers a portion of an upper surface of etch film 106 and is disposed between the first and second mask patterns 130 and 150a of a corresponding mask pattern pair 130,150a of a plurality of mask pattern pairs 130,150a. When anisotropically dry etching hard mask layer 220, the depth to which hard mask layer 220 is etched is controlled such that residual protection films 220b will each have a desired thickness. Each residual protection film 220b may have any thickness that protection film 110 (described above with reference to FIG. 1) may have. That is, each residual protection film may have a thickness of about 50 to 400 Å.

Figure 2C:
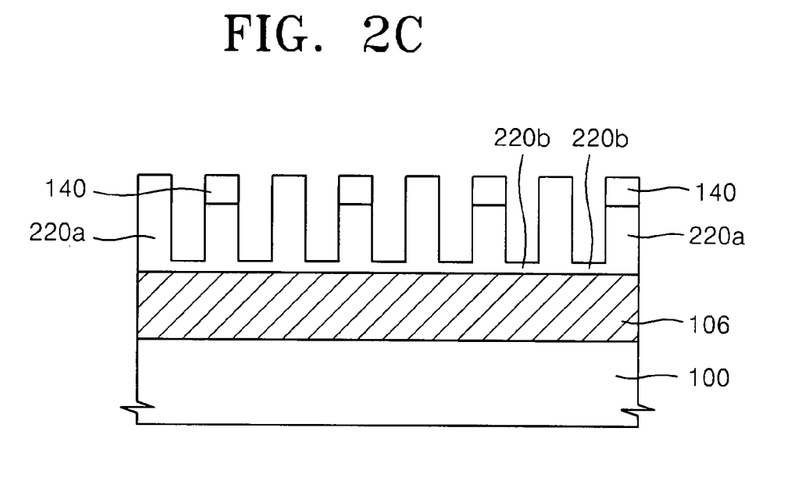

Referring to FIG. 2C, first and second mask patterns 130 and 150a are removed through the same method as the method described with reference to FIG. 1J. In the embodiment illustrated in FIG. 2, when first and second mask patterns 130 and 150a are removed, etch film 106 is covered by residual protection films 220b. Therefore, etch film 106 is not damaged by the etching atmosphere that exists when removing first and second mask patterns 130 and 150a.

Figure 2D:
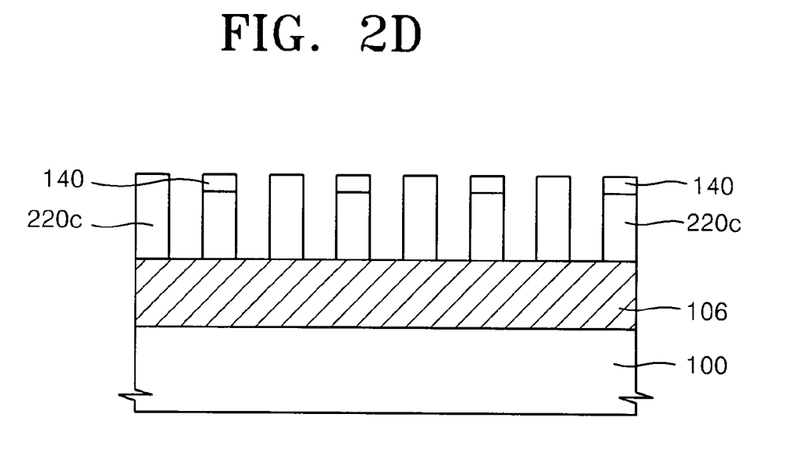

Referring to FIG. 2D, as in the method for removing protection film 110 described with reference to FIG. 1K, residual protection films 220b of the hard mask pattern layer are removed using hard mask patterns 220a and buffer layer 140 as an etch mask. By removing residual protection films 220b, hard mask patterns 220c exposing portions of etch film 106 are formed.

Figure 2E:
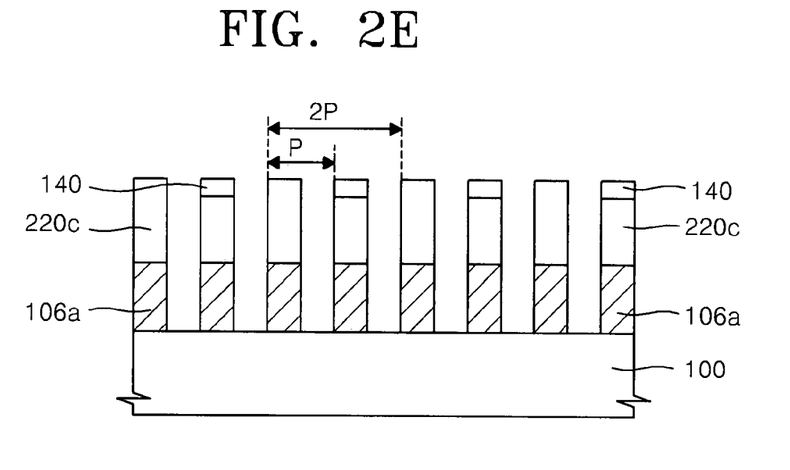

Referring to FIG. 2E, to form fine patterns 106a, the portions of etch film 106 exposed between adjacent hard mask patterns 220c are anisotropically dry etched using hard mask patterns 220c and buffer layer 140 (which is disposed on some of hard mask patterns 220c) as an etch mask through a method that is the substantially the same as the method described with reference to FIG. 1L. By etching the portions of etch film 106 exposed between hard mask patterns 220c, fine patterns 106a having first width $W_1$ or second width $W_2$, each of which is equal to one fourth (¼) of first pitch 2P, are formed. In addition, fine patterns 106a are characterized by second pitch P, which is equal to one half (½) of first pitch 2P.

Also, in the embodiment illustrated in FIG. 2, the dry etching of etch film 106 is performed after first and second mask patterns 130 and 150a formed from polysilicon are removed from hard mask patterns 220c and buffer layer 140. Therefore, problems that may occur as a result of exposing polysilicon in an etching atmosphere (e.g., reducing the rate at which etch film 106 is etched and producing fine patterns 106a having poor sidewall profiles as a result of etching etch film 106) can be substantially prevented. Furthermore, fine patterns 106a having improved sidewall profiles can be produced.

In addition, although not shown in FIG. 2, after etching etch film 106 to form fine patterns 106a, trenches may be formed in semiconductor substrate 100 by etching semiconductor substrate 100 using at least hard mask patterns 220c as an etch mask. Then, isolation regions may be formed by filling the trenches with an insulating film. The process of forming isolation regions by filling the trenches with an insulating film may be performed through a process similar to the process described below with reference to FIG. 3G.

FIGS. 3A through 3G are cross-sectional views illustrating a method for forming fine patterns of a semiconductor device in accordance with another embodiment of the invention. In FIGS. 3A through 3G (i.e., FIG. 3) and FIG. 1, like reference symbols indicate like or similar (i.e., equivalent) elements, so elements present in FIGS. 1 and 3 may not be described again with reference to FIG. 3.

Figure 3A:
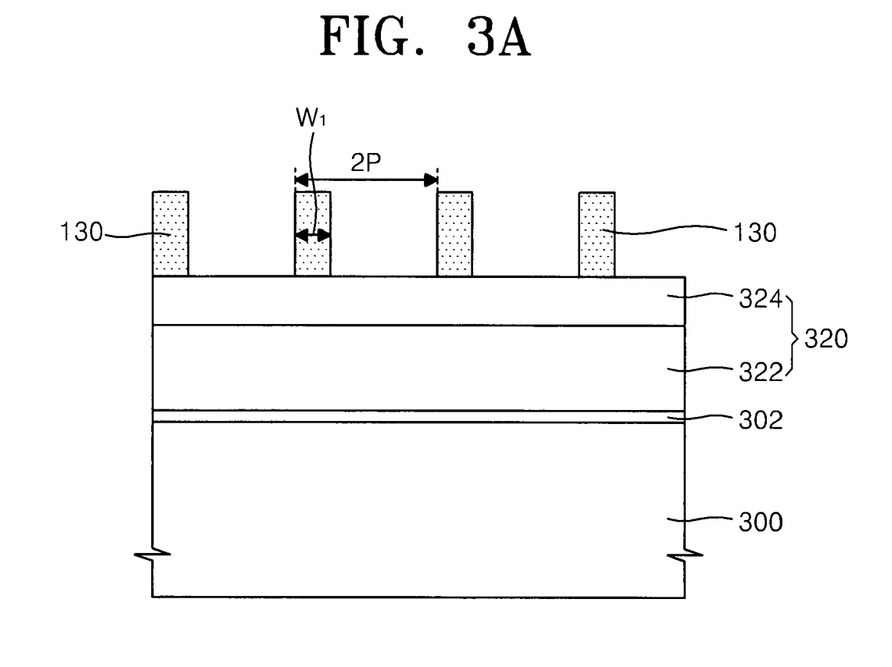

Referring to FIG. 3A, a pad oxide film 302 is formed on a semiconductor substrate 300. In addition, a hard mask layer 320 and first mask patterns 130 are formed on pad oxide film 302 in method similar to that of forming of hard mask layer 120 and first mask patterns 130 described with reference to FIGS. 1A and 1B. However, in the embodiment illustrated in FIG. 3, hard mask layer 320 has a double-layered structure comprising a nitride film 322 and an oxide film 324, wherein nitride film 322 and oxide film 324 are sequentially stacked.

Figure 3B:
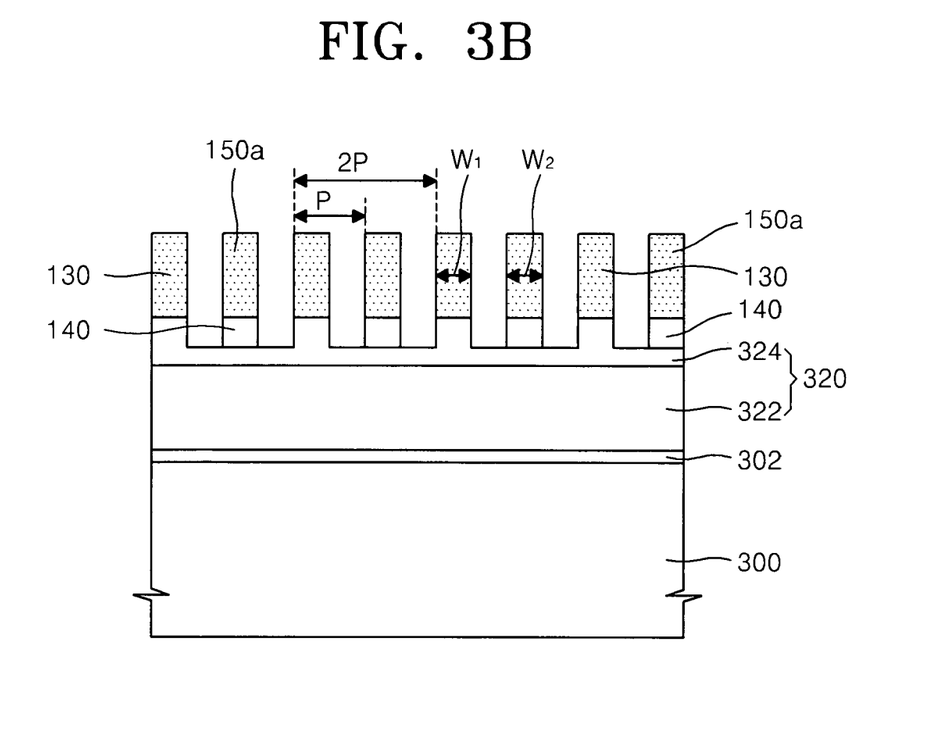

Referring to FIG. 3B, a buffer layer 140 and second mask patterns 150a are formed on oxide film 324 of hard mask layer 320 in accordance with the method described with reference to FIGS. 1C through 1H.

Figure 3C:
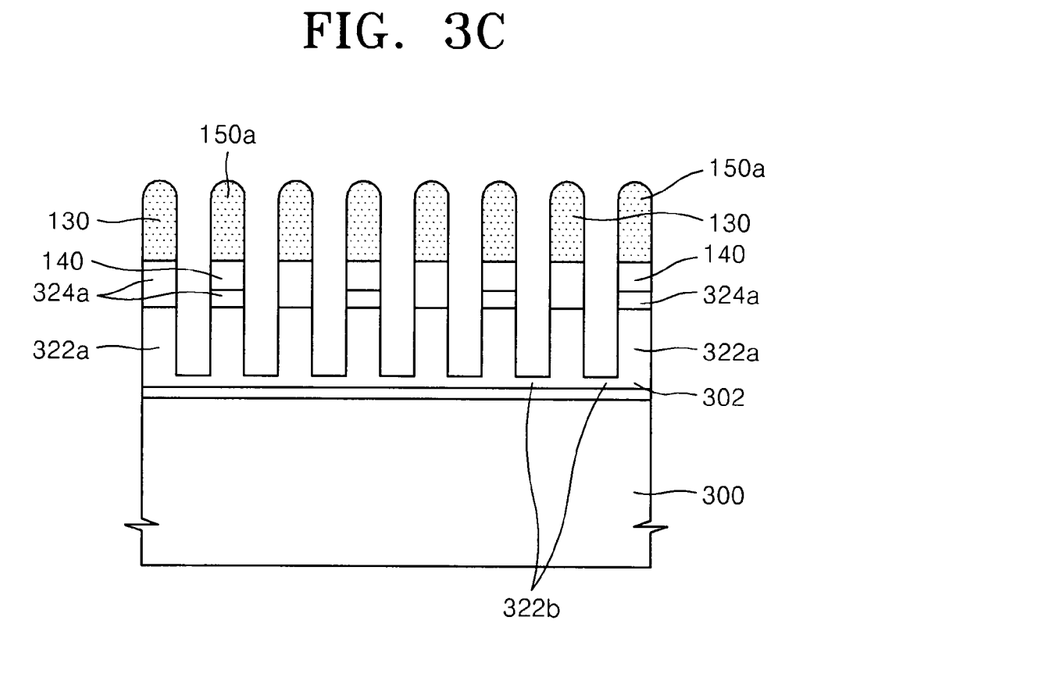

Referring to FIG. 3C, oxide film 324 and nitride film 322, which form hard mask layer 320, are anisotropically dry-etched sequentially to form oxide film patterns 324a and nitride film patterns 322a (similar to the method described with reference to FIG. 1I) using first and second mask patterns 130 and 150a as an etch mask. In the embodiment illustrated in FIG. 3, similar to the process described with reference to FIG. 2B, when etching nitride film 322, the depth to which nitride film 322 is etched is controlled so that a hard mask pattern layer comprising nitride film patterns 322a and residual protection films 322b is formed. Residual protection films 322b are disposed between first and second mask patterns 130 and 150a of mask pattern pairs 130,150a. That is, each residual protection film 322b is disposed between the first and second mask patterns 130 and 150a of corresponding mask pattern pair 130,150a of a plurality of mask pattern pairs 130,150a. Each residual protection film is also disposed on pad oxide film 302. Each residual protection film 322b may have any thickness that protection film 110 (described above with reference to FIG. 1) may have. That is, each residual protection film may have a thickness of about 50 to 400 Å.

Figure 3D:
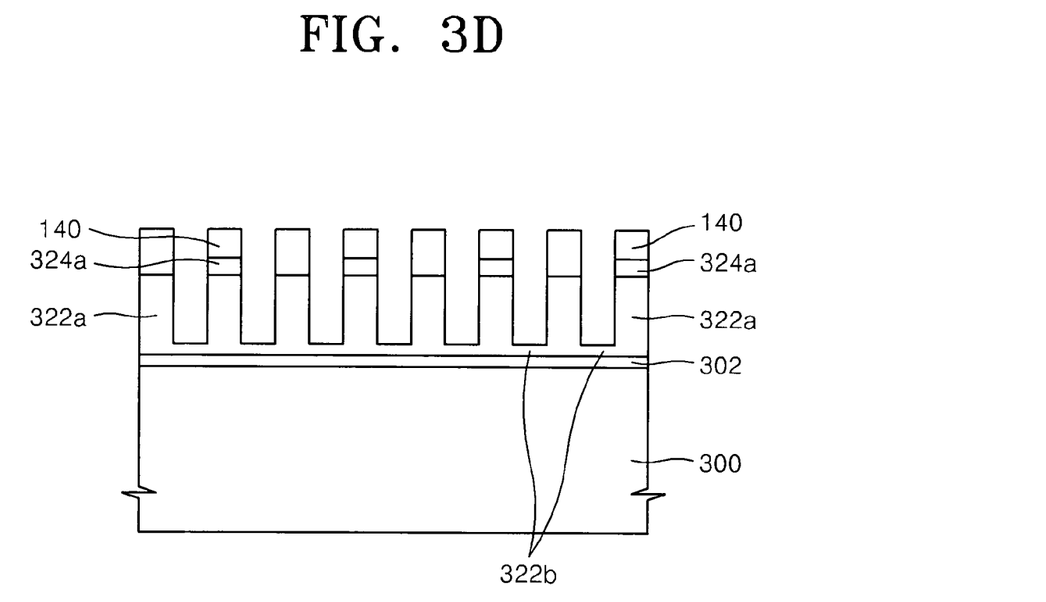

Referring to FIG. 3D, first and second mask patterns 130 and 150a are removed through the method described with reference to FIG. 1J. In the embodiment illustrated in FIG. 3, while first and second mask patterns 130 and 150a are removed, the underlying pad oxide film 302 and semiconductor substrate 300 are covered by the hard mask pattern layer (which comprises nitride film patterns 322a and residual protection films 322b). Therefore, pad oxide film 302 and semiconductor substrate 300 are not damaged by the etching atmosphere that exists when removing first and second mask patterns 130 and 150a.

Figure 3E:
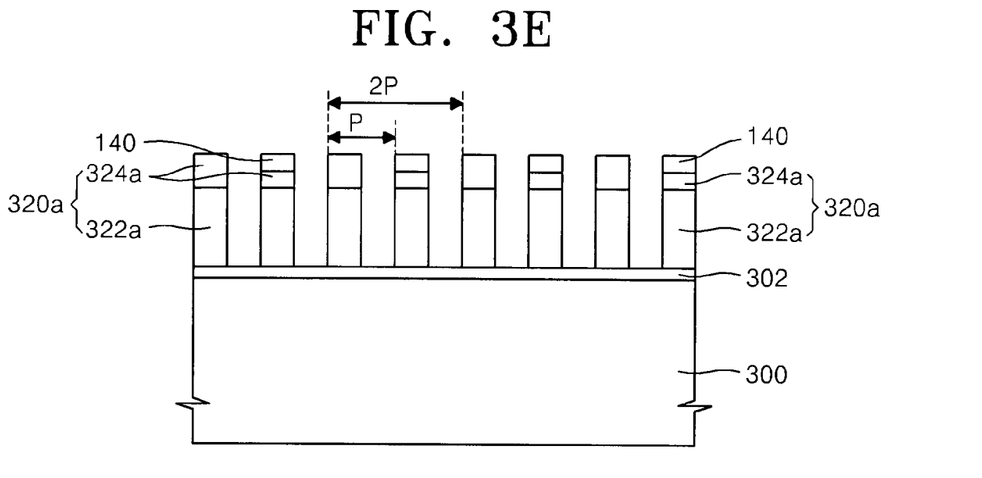

Referring to FIG. 3E, through a method similar to the method for removing protection film 110 described with reference to FIG. 1K, residual protection films 322b are removed (through etching) using hard mask patterns 320a and buffer layer 140 as an etch mask in order to expose portions of pad oxide film 302. Each hard mask pattern 320a comprises one of nitride film patterns 322a and one of oxide film patterns 324a. Hard mask patterns 320a are disposed on pad oxide film 302 and are characterized by fine pitch P, which is equal to one half (½) of first pitch 2P.

Although, in FIG. 3E, buffer layer 140 is left on some of hard mask patterns 320a, buffer layer 140 can be completely removed during the process of etching residual protection films 322b. Alternatively, the exposed portions of oxide film patterns 324a, buffer layer 140, and pad oxide film 302 left on the resultant structure of FIG. 3E can be removed with a high etch selectivity with respect to semiconductor substrate 300. In that case, dry etching may be performed using a mixed gas comprising $O_2$ and $C_aF_b$ (where, as described previously, "a" is an integer in a range of 1 to 6 and "b" is an integer in a range of 3 to 8) as an etchant. For example, an etchant obtained by mixing, in a volume ratio of 1:1, $O_2$ gas and any gas such as $C_3F_8$, $C_4F_6$, $C_4F_8$, and $C_5F_8$ may be used. Ar may be added to the etchant as needed. Also, the dry etching may be performed in a plasma atmosphere generated by the etchant.

Figure 3F:
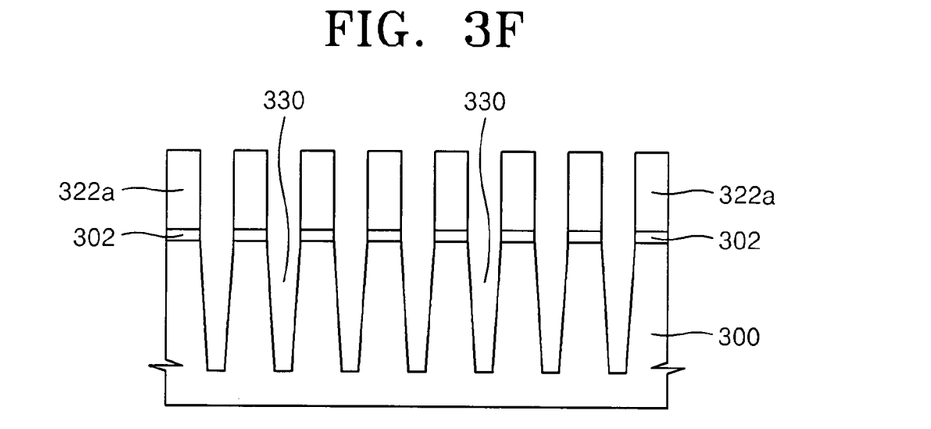

Referring to FIG. 3F, pad oxide film 302 and semiconductor substrate 300 are anisotropically etched using hard mask patterns 320a as an etch mask, thereby forming trenches 330 in semiconductor substrate 300. Referring to FIG. 3F, trenches 330 are formed by dry etching semiconductor substrate 300, and the dry etching process for forming trenches 330 completely removes oxide film patterns 324a and buffer layer 140 (of, e.g., FIG. 3E) from semiconductor substrate 300. Alternatively, each oxide film pattern 324a may be left on the nitride film pattern 322a on which it is formed and each portion of buffer layer 140 may be left on the nitride film pattern 322a on which it is formed.

Figure 3G:
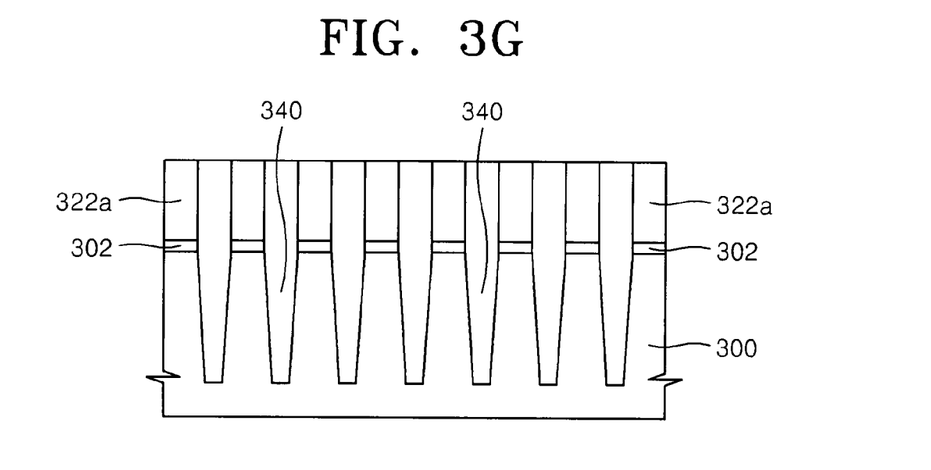

Referring to FIG. 3G, after an insulating material is deposited in trenches 330 and on nitride film patterns 322a, the resultant structure is planarized through chemical mechanical polishing (CMP) until nitride film patterns 322a are exposed in order to form an insulating film 340 filling trenches 330 and thereby form isolation regions.

Referring to FIGS. 3A through 3G, trenches 330 formed in semiconductor substrate 300 to form isolation regions are formed by double patterning. Thus, isolation patterns characterized by a relatively fine pitch equal to one half (½) of the pitch typically obtained using photolithography can be formed. Thus, relatively fine isolation regions characterized by a relatively fine pitch, wherein the relatively fine pitch is not limited by the resolution restrictions of photolithography, can be readily formed.

In a method for forming fine patterns of a semiconductor device in accordance with an embodiment of the invention, when double patterning is used to form patterns characterized by a fine pitch equal to one half (½) of a pitch typically obtained using photolithography, a protection film covering an etch film is used to help prevent the etch film from being damaged when removing mask patterns formed from polysilicon.

In a method for forming fine patterns in accordance with an embodiment of the invention, an etch film is etched after removing mask patterns formed from polysilicon. Etching the etch film while polysilicon is exposed may reduce the rate at which the etch film is etched and may produce fine patterns having inferior sidewall profiles. Thus, because the polysilicon is removed before etching the etch film, fine patterns formed in accordance with an embodiment of the invention will have desirable vertical sidewall profiles. In addition, the mask patterns formed from polysilicon are removed while the etch film is covered with a protection film, thereby preventing the etch film from being damaged while removing the mask patterns.

In accordance with embodiments of the invention, an adverse effect that polysilicon left on hard mask patterns has upon an etch rate when etching an etch film, and upon a sidewall profile of resulting fine patterns, can be reduced when using the hard mask patterns formed by double patterning as at least a portion of an etch mask when etching the etch film after removing mask patterns formed from polysilicon from the hard mask patterns. Thus, patterns that have a desired form and that are characterized by a fine pitch that overcomes the resolution restrictions of photolithography can be readily produced.

Although embodiments of the invention have been described herein, various modifications may be made to the embodiments by those of ordinary skill in the art without departing from the scope of the invention as defined by the accompanying claims.

What is claimed is:

1. A method for forming fine patterns of a semiconductor device comprising:
    forming an etch film on a substrate;
    forming a protection film on the etch film;
    forming a hard mask layer on the protection film;
    forming a plurality of first mask patterns characterized by a first pitch on the hard mask layer;
    forming a plurality of second mask patterns, wherein each second mask pattern is disposed between two adjacent first mask patterns of the plurality of first mask patterns;
    forming hard mask patterns exposing first portions of the protection film by etching the hard mask layer using the first and second mask patterns as an etch mask;
    removing the first and second mask patterns;
    exposing portions of the etch film by removing the first portions of the protection film; and,
    forming a plurality of fine patterns characterized by a second pitch equal to half of the first pitch by etching the etch film using at least the hard mask patterns as an etch mask.

2. The method of claim 1, wherein bottom surfaces of the first and second mask patterns are disposed directly on a plane parallel with a working surface of the substrate.

3. The method of claim 2, wherein forming the plurality of second mask patterns comprises:
    forming a buffer layer on the plurality of first mask patterns, wherein the buffer layer has recesses and each of the recesses is disposed between two adjacent first mask patterns of the plurality of first mask patterns; and,
    forming second mask patterns in the recesses of the buffer layer.

4. The method of claim 3, further comprising, after forming the second mask patterns and before forming the hard mask patterns, exposing first portions of the hard mask layer by dry etching the buffer layer, using the first and second mask patterns as an etch mask, until the first portions of the hard mask layer are exposed.

5. The method of claim 4, further comprising, after forming the second mask patterns and before exposing the first portions of the hard mask layer, exposing upper surfaces of the first mask patterns by partially removing the buffer layer.

6. The method of claim 5, wherein partially removing the buffer layer comprises performing wet etching or dry etching.

7. The method of claim 3, further comprising, after forming the plurality of first mask patterns and before forming the buffer layer, forming hard mask layer recesses in an upper surface of the hard mask layer by removing upper exposed portions of the hard mask layer,
    wherein:
        each of the hard mask layer recesses has a depth equal to a recess depth;
        forming the hard mask layer recesses forms low surface portions in the hard mask layer; and,
        the buffer layer conformally covers each of the first mask patterns and each of the low surface portions with a uniform thickness equal to the recess depth.

8. The method of claim 3, wherein the hard mask layer is an oxide film, the buffer layer is an oxide film, and the protection film is a nitride film.

9. The method of claim 3, wherein the hard mask layer is a nitride film, the buffer layer is a nitride film, and the protection film is an oxide film.

10. The method of claim 3, wherein the hard mask layer comprises a nitride film disposed on the etch film and an oxide film disposed on the nitride film, and the buffer layer comprises an oxide film.

11. The method of claim 1, wherein each of the first mask patterns and each of the second mask patterns comprises polysilicon.

12. The method of claim 1, wherein removing the first and second mask patterns comprises performing dry etching using as an etchant a mixed gas comprising $O_2$ gas and at least one of HBr and $Cl_2$.

13. The method of claim 12, wherein the mixed gas further comprises He gas.

14. The method of claim 12, wherein the dry etching is performed in a plasma atmosphere generated from the etchant.

15. The method of claim 1, wherein removing the first and second mask patterns comprises performing wet etching using as an etchant a mixed solution comprising $NH_4OH$, $H_2O_2$, and $H_2O$.

16. The method of claim 1, wherein the hard mask layer comprises at least one of an oxide film and a nitride film.

17. The method of claim 1, wherein the protection film comprises a first material and the hard mask layer comprises a second material having different etching characteristics than the first material.

18. The method of claim 1, wherein the etch film comprises at least one of a conductive material, a semiconducting material, and an insulating material.

19. The method of claim 1, wherein the etch film comprises a material selected from the group consisting of tungsten, tungsten silicide, polysilicon, and aluminum.

20. The method of claim 1, wherein etching the etch film is performed using an etchant comprising fluoride atoms.

21. The method of claim 1, wherein etching the etch film is performed under first etching conditions, and removing the first portions of the protection film comprises etching the protection film under the first etching conditions.

22. The method of claim 1, wherein each of the first mask patterns and each of the second mask patterns has a width that is equal to one fourth (¼) of the first pitch.

23. The method of claim 1, further comprising:
    after etching the etch film, forming trenches in the substrate by etching the substrate using at least the hard mask patterns as an etch mask; and,
    forming isolation regions by filling the trenches with an insulating film.

24. A method for forming fine patterns of a semiconductor device comprising:
    forming an etch film on a substrate;
    forming a hard mask layer on the etch film;
    forming a plurality of first mask patterns characterized by a first pitch on the hard mask layer;
    forming a plurality of second mask patterns, wherein each second mask pattern is disposed between two adjacent first mask patterns of the plurality of first mask patterns;
    forming a hard mask pattern layer comprising first hard mask patterns and residual protection films by etching the hard mask layer using the first and second mask patterns as an etch mask, wherein each residual protection film covers one of a plurality of first portions of the etch film and each first portion of the etch film is disposed between a pair of adjacent first hard mask patterns;
    removing the first and second mask patterns;
    exposing portions of the etch film and forming second hard mask patterns by removing the residual protection films; and,
    forming a plurality of fine patterns characterized by a second pitch equal to half of the first pitch by etching the etch film using the second hard mask patterns as an etch mask.

25. The method of claim 24, wherein bottom surfaces of the first and second mask patterns are disposed directly on a plane parallel with a working surface of the substrate.

26. The method of claim 25, wherein forming the plurality of second mask patterns comprises:
    forming a buffer layer on the plurality of first mask patterns, wherein the buffer layer has recesses and each of the recesses is disposed between two adjacent first mask patterns of the plurality of first mask patterns; and,
    forming second mask patterns in the recesses of the buffer layer.

27. The method of claim 26, further comprising, after forming the second mask patterns and before forming the hard mask pattern layer, exposing first portions of the hard mask layer by dry etching the buffer layer, using the first and second mask patterns as an etch mask, until the first portions of the hard mask layer are exposed.

28. The method of claim 27, further comprising, after forming the second mask patterns and before exposing the first portions of the hard mask layer, exposing upper surfaces of the first mask patterns by partially removing the buffer layer.

29. The method of claim 28, wherein partially removing the buffer layer comprises performing wet etching or dry etching.

30. The method of claim 26, further comprising, after forming the plurality of first mask patterns and before forming the buffer layer, forming hard mask layer recesses in an upper surface of the hard mask layer by removing upper exposed portions of the hard mask layer,
    wherein:
        each of the hard mask layer recesses has a depth equal to a recess depth;
        forming the hard mask layer recesses forms low surface portions in the hard mask layer; and,
        the buffer layer conformally covers each of the first mask patterns and each of the low surface portions with a uniform thickness equal to the recess depth.

31. The method of claim 26, wherein the hard mask layer is a nitride film and the buffer layer is a nitride film.

32. The method of claim 24, wherein the first mask patterns are formed from polysilicon and the second mask patterns are formed from polysilicon.

33. The method of claim 24, wherein removing the first and second mask patterns comprises performing dry etching using as an etchant a mixed gas comprising $O_2$ gas and at least one of HBr and $Cl_2$.

34. The method of claim 33, wherein the mixed gas further comprises He gas.

35. The method of claim 33, wherein the dry etching is performed in a plasma atmosphere generated from the etchant.

36. The method of claim 24, wherein removing the first and second mask patterns comprises performing wet etching using as an etchant a mixed solution comprising $NH_4OH$, $H_2O_2$, and $H_2O$.

37. The method of claim 24, wherein the hard mask layer is a nitride film.

38. The method of claim 24, wherein the hard mask layer has a double layered structure and forming the hard mask layer comprises sequentially stacking a nitride film and an oxide film.

39. The method of claim 38, wherein the residual protection film is a nitride film.

40. The method of claim 38, wherein the buffer layer is an oxide film.

41. The method of claim 24, wherein the etch film comprises at least one of a conductive material, a semiconducting material, and an insulating material.

42. The method of claim 24, wherein the etch film comprises a material selected from the group consisting of tungsten, tungsten silicide, polysilicon, and aluminum.

43. The method of claim 24, wherein etching the etch film is performed using an etchant comprising fluoride atoms.

44. The method of claim 24, wherein etching the etch film is performed under first etching conditions, and removing the residual protection film comprises etching the residual protection film under the first etching conditions.

45. The method of claim 24, wherein each of the first mask patterns and each of the second mask patterns has a width that is equal to one fourth (¼) of the first pitch.

46. The method of claim 24, further comprising:

after etching the etch film, forming trenches in the substrate by etching the substrate using the second hard mask patterns as an etch mask; and, forming isolation regions by filling the trenches with an insulating film.

* * * * *